United States Patent [19]
Jones

[11] Patent Number: 5,738,904
[45] Date of Patent: Apr. 14, 1998

[54] METHOD AND APPARATUS FOR VARIABLE SPEED MATERIAL DEPOSITION

[75] Inventor: Stephen M. Jones, Shrewsbury, Mass.

[73] Assignee: HTI Engineering Inc., Medfield, Mass.

[21] Appl. No.: 589,550

[22] Filed: Jan. 22, 1996

Related U.S. Application Data

[63] Continuation of Ser. No. 496,929, Jun. 30, 1995.

[51] Int. Cl.$^6$ .............................. B05D 1/32; B05C 7/00; B41M 1/12
[52] U.S. Cl. .............................. 427/96; 427/282; 427/287; 101/123; 101/129; 118/120; 118/213; 118/406; 118/504
[58] Field of Search .............................. 118/120, 213, 118/242, 406, 504, 664, 698; 427/96, 8, 282, 287; 101/123, 129

[56] References Cited

U.S. PATENT DOCUMENTS

| | | | |
|---|---|---|---|
| 4,009,047 | 2/1977 | Lindsay | 134/9 |
| 4,413,559 | 11/1983 | Bubley | 101/123 |
| 4,414,894 | 11/1983 | Bailly | 101/123 |
| 4,781,114 | 11/1988 | Ericsson | 101/123 |
| 4,919,970 | 4/1990 | Hoebener et al. | 427/96 |
| 5,044,306 | 9/1991 | Erdmann | 118/120 |
| 5,050,496 | 9/1991 | Klemm | 101/123 |
| 5,254,362 | 10/1993 | Shaffer et al. | 427/96 |
| 5,332,439 | 7/1994 | Watanabe et al. | 118/406 |
| 5,388,508 | 2/1995 | Dubuit | 101/123 |
| 5,436,028 | 7/1995 | Becker | 427/96 |
| 5,553,538 | 9/1996 | Freitag | 101/123 |

FOREIGN PATENT DOCUMENTS

| | | |
|---|---|---|
| 63-199643 | 6/1988 | Japan . |
| 4-338541 | 4/1992 | Japan . |

OTHER PUBLICATIONS

Global Manufacturing, Inc. (1992) "Innovations in Technology".

Primary Examiner—Shrive Beck
Assistant Examiner—Fred J. Parker
Attorney, Agent, or Firm—Lahive & Cockfield, LLP

[57] ABSTRACT

This invention provides for methods and apparatus for increasing the speed of material deposition by a blade element traversing across an apertured mask. The invention involves varying the velocity of the blade element as it sweeps across different sections of the apertured mask. Varying the sweep velocity of the blade element allows for increases in the average speed of material deposition while retaining precision in the application of material deposited through the apertured mask.

17 Claims, 3 Drawing Sheets

5,738,904

METHOD AND APPARATUS FOR VARIABLE SPEED MATERIAL DEPOSITION

REFERENCE TO RELATED APPLICATIONS

This is a continuation of U.S. patent application Ser. No. 08/496,929 filed on Jun. 30, 1995 which is expressly incorporated herein by reference.

BACKGROUND OF THE INVENTION

This invention relates generally to an apparatus and method for depositing material through an apertured mask. More particularly, the invention relates to a system for transferring material through an apertured mask with a moving blade. One particular application of the invention relates to the manufacture of circuits constructed according to a technique termed surface mount technology, where electrical components are mounted to the surface of a printed circuit board with solder paste, or other conductive mounting material. In surface mount technology, a printed circuit board is prepared by applying solder paste to the surface of the circuit board through an apertured mask with a moving blade.

The prior art teaches a variety of methods and structures for applying an extrudable material, such as a solder paste, to a flat surface. One conventional technique involves applying the extrudable material through a mask having apertures arranged in a pattern corresponding to the desired placement of the extrudable material on the flat surface. The extrudable material is placed on the mask and a blade or squeegee element sweeps across the mask, forcing the extrudable material through the apertures in the mask. Generally, the extrudable material is applied with a single sweep of the blade across the apertured mask.

This practice is used in manufacturing printed circuit boards employing surface mount technology. In surface mount technology, the leads of electronic components are secured to pads on the surface of a circuit board and the pads are interconnected by conductive paths. In one manufacture of such circuit boards, a mask is formed having apertures representative of the pads used for mounting electrical components to the printed circuit board. The openings or apertures in the mask vary in size and in density on the board.

The apertured mask is placed over the circuit board, and a blade element applies a conductive mounting material through the aperture in the mask to the circuit board in the desired pattern formed by the apertured mask. The mounting materials are generally compounds with both adhesive and electrical conduction properties, such as solder paste and conductive epoxy. A variety of conductive epoxies are available, for example, from Epoxy Technology, Incorporated, Billerica, Mass. After applying solder paste to the circuit board, leads of various electronic components are placed on the printed circuit board at the sites bearing the solder paste. The solder paste is then heated and allowed to cool, thereby securing the components to the board and connecting them electrically to the conductive paths on the circuit board.

One problem in the application of an extrudable material to a flat surface through an apertured mask involves the speed with which the extrudable material can be forced through the openings in the mask by the moving blade, while retaining an acceptable fidelity in the applied extrudable material. "Fidelity", as used herein, includes resolution, reproducibility and definition. "Resolution" refers to the minimum distance between two adjacent mask apertures capable of ensuring no inadvertent contact between extruded material sites on the flat surface. "Reproducibility" refers to the maximum variation in extrudable material patterns between any two printed surfaces manufactured with the same mask. "Definition" refers to the precision with which the extruded material pattern reflects the apertures of the mask. Applying the extrudable material with a relatively fast blade speed is desirable to save time and thereby to increase the number of circuit boards processed in a given time.

Others have attempted to increase the speed of applying the extrudable material by increasing the sweep speed of the blade across the entire mask. This technique can result, however, in unacceptable fidelity. For example, in the manufacture of printed circuit boards, increasing the sweep speed of the blade across smaller dimensioned apertures results in less than sufficient extrudable material being applied through the apertures and onto the circuit board. The insufficient quantity of extrudable material in mm results in less precise definition in the smaller pads on the circuit board, and a greater likelihood of problems in the reproducibility of the pattern of apertures in the mask. As electrical components diminish in size and increase in density, the blade speed is to decrease to retain acceptable fidelity, thus reducing the production rate of the circuit boards and increasing the cost of production.

Accordingly, one object of this invention is to provide an apparatus and method that increases the overall speed with which extrudable material can be applied through an apertured mask.

A particular objective is to attain a rapid mask production of printed circuit boards having a high density of components.

A further object is to increase the rate of production of circuit boards while retaining the high fidelity required in the production of printed circuit boards.

These and other objects will be apparent from the description that follows.

SUMMARY OF THE INVENTION

The invention attains the foregoing objects by providing a machine for varying the sweep speed of a blade element across an apertured mask according to the size of the apertures in the mask. In particular, the sweep speed is lowered when the blade traverses a small aperture, and the sweep speed is increased when the blade traverses a large aperture, thus increasing the average speed of the blade while retaining an acceptable level of fidelity.

One machine according to the invention has a blade element for transferring extrudable material through openings in a mask during a sweeping motion by the blade element across the apertured mask, a variable speed motor for moving the blade element across the mask along a first axis, a motor controller for controlling the velocity of the variable speed motor, and an addressable storage element coupled with the motor controller for storing data associating velocities of the sweeping motion of the blade with different locations along the mask. The apparatus and method of the invention involve sweeping the blade element across the mask at an adjustable velocity, during the material applying sweep of the blade element across the mask. In particular, the blade element is swept quickly across sections of the mask having large dimensioned apertures, and the blade element is swept slowly across sections of the mask having small dimensioned apertures, thus allowing an increase in the average speed of the blade moving across the mask.

According to one aspect of the invention, the motor control element can include a governor element for controlling the acceleration, or rate of change in the velocity, of the variable speed motor and hence of the blade element coupled to the variable speed motor. The governor element limits the acceleration of the variable speed motor to a predetermined range to prevent unwanted discontinuities in the movement of the blade across the mask. Such discontinuities can include a jumping or other discontinuous motion of the blade across the mask caused by excessive acceleration.

Another aspect of the invention includes a data processing element for ensuring that the blade reaches the desired velocity at a predetermined location on the mask. The data processor calculates the distance necessary to change from one velocity of the blade element to a desired new velocity for the blade. This distance can be determined based upon the present velocity, the new velocity, and the desired maximal acceleration of the blade element.

A further aspect of the invention includes an input system for the addressable storage element. In one embodiment, the input system has a detector for detecting the location of the blade element relative to the mask, and a receiver for obtaining a velocity to be associated with the detected location in the addressable storage element. An operator can use this embodiment of the input system to create manually a set of speed zones in the addressable storage element. A second embodiment of the input system can include a reader for reading a data file, e.g. a CAD file containing layout information for the apertured mask, and an analyzer for determining from the layout information a velocity to associate with each of particular locations on the apertured mask. A third embodiment of the input system can include an optical scanner for determining the layout of the apertured mask, and an analyzer for determining, from the layout information obtained through the optical scanner, velocity values to associate with various locations along the mask.

BRIEF DESCRIPTION OF THE FIGURES

The above and further features of the invention are set forth with particularity in the claims and will be further understood from consideration of the following description of illustrative embodiments with reference to the accompanying drawings, in which:

DESCRIPTION OF THE ILLUSTRATED EMBODIMENTS

Figure 1:
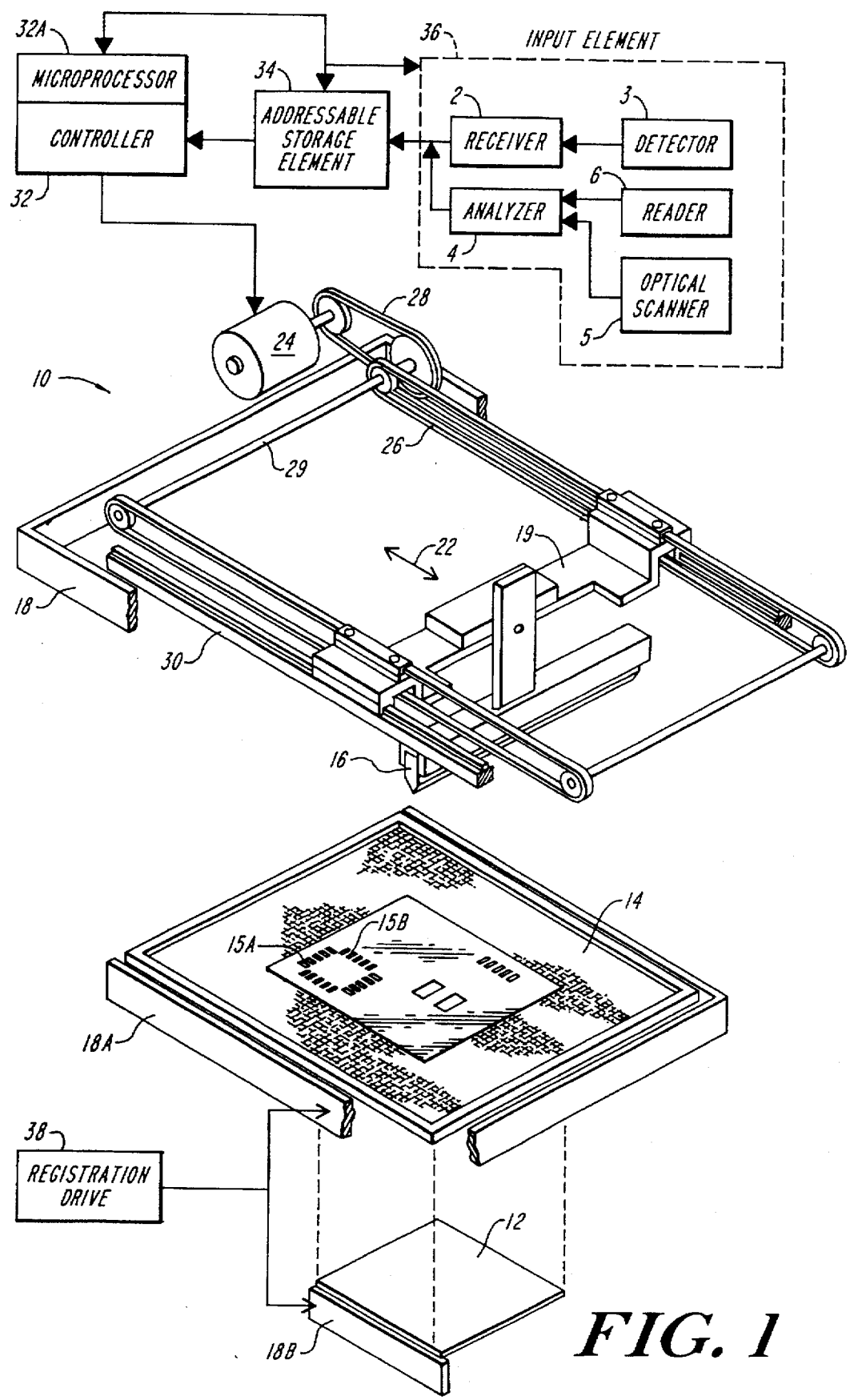
FIG. 1 is a fragmentary exploded view, partly in perspective, of an extrudable material deposition system according to the invention, with the controller, the addressable storage element, and the input element for the variable speed motor shown in block form.

FIG. 1 shows a circuit board manufacturing system 10 according to the invention for applying an extrudable material (not shown) to a circuit board 12 through an apertured mask 14 by movement of a blade element 16 across the mask surface. The illustrated machine 10 performs one of many steps in the manufacturing of circuit board 12, namely applying extrudable materials to circuit board 12.

The machine 10 has a pair of substantially parallel guide rails 30 mounted to frame 18. Sweep arm 19 is secured to the machine frame 18 by guide rails 30. The sweep arm 19 slides along the length of the guide rails 30 and carries the blade 16 in the direction of the arrow 22. The guide rails 30 allow for the sweeping motion of the sweep arm 19 back and forth across the surface of the apertured mask 14 in the direction of the arrow 22. Thus, the sweep arm 19 can move along the rails 30 across the surface of the apertured mask 14 with a continuous linear motion in the direction of the arrow 22.

System 10 includes a motor 24, typically an electric motor, for moving blade element 16. In particular, motor 24 rams a first drive belt 28, that in turn causes the rotation of a drive shaft 29. The rotation of drive shaft 29 moves a second drive belt 26 along direction 22. Drive belt 26 is coupled to sweep arm 19. Thus, the movement of drive belt 26 moves sweep arm 19 along direction 22. Blade element 16 is mounted to sweep arm 19. Thus, the action of motor 24 is translated into the movement of blade element 16 along direction 22.

Apertured mask 14 and flat panel 12 are removeably and replaceably held in frame sections 18A and 18B, respectively. Frame sections 18A and 18B support flat panel 12 in a plane substantially parallel to apertured mask 14. A registration drive 38 selectively provides precision control movement of frame sections 18A and 18B relative to the each other, thereby aligning flat panel 12 precisely with, and in abutment with, apertured mask 14. The alignment of mask 14 and panel 12 allows extrudable material to be evenly applied to panel 12 as blade element 16 travels across the surface of mask 14.

FIG. 1 further illustrates a system 10 according to the invention for increasing the average speed at which extrudable material is applied. In FIG. 1, an addressable storage element 34 stores data associating velocity values with particular positions and provides the data to controller 32. Controller 32 modifies the speed of motor 24 according to the data stored in addressable storage element 34. Blade element 16 is coupled with motor 24, and blade element 16 moves at a variable rate determined by the speed of motor 24.

Addressable storage element 34 stores information indicative of positions along mask 14 during which the speed of blade element 16 is increased, and indicative of positions along mask 14 during which the speed of blade element 16 is decreased. Controller 32 accordingly increases the speed of motor 24 to the velocity value stored in addressable storage element 34 when blade element 16 passes over areas in mask 14 allowing increased velocity, and controller 32 decreases the speed of motor 24 to the velocity value stored in addressable storage element 34 when blade element 16 passes over areas in mask 14 requiring decreased velocity. Rather than sweeping blade element 16 at one predetermined velocity across apertured mask 14, this invention allows the sweep speed of blade element 16 to increase when such increases do not cause decreased fidelity in the application of the extrudable material. Adjusting the sweep velocity of blade element 16, as indicated above, allows the average sweep speed during application of the extrudable material to increase.

For example, as further illustrated in FIG. 1, blade element 16 moves along a direction 22, and apertured mask 14 contains openings 15A and 15B having different dimensions as measured along direction 22. Opening, or aperture, 15A has a dimension along direction 22 longer than the dimension of opening 15B along direction 22. Addressable storage element 34 can store the position of opening 15A along direction 22 and associate with this position a first velocity, $V_A$. Addressable storage element 34 can also store the position of opening 15B along direction 22 and associate with this position a second velocity, $V_B$. As blade element 16 sweeps across opening 15A in mask 14 it has a velocity $V_A$ and as blade element 16 sweeps across opening 15B it has a velocity $V_B$. Preferably, $V_A$ is greater than $V_B$ because blade element 16 can sweep across the larger opening 15A at a higher speed without causing a loss in fidelity.

The construction of system 10 can be implemented in several ways. Addressable storage element 34 is a mechanical element associating position and velocity values, a look-up table associating positions and velocities, or an electronic memory device, such as a magnetic memory element, for storing electronic signals indicative of position and velocity values. Controller 32 is a mechanical or electronic device capable of selecting the appropriate position and corresponding velocity from addressable storage element 34, and capable of directing the speed of variable speed motor 24 according to the data obtained from storage element 34. Blade element 16 is composed of either a resilient material, such as a durable metal, or a flexible material, such as a plastic or other elastomeric compound. Flexible blade elements utilized may have high or low durometer ratings.

With reference again to FIG. 1, an input element 36 is coupled with the addressable storage element 34 and generates the data set stored in addressable storage element 34. The illustrated input element 36 includes a detector element 3 coupled with a receiver element 2. The detector 3 determines the position of blade element 16 along direction 22 relative to mask 14, and the receiver 2 obtains a velocity value to be associated with the detected position in storage element 34. Once receiver 2 has associated a velocity with a given position, it passes the data onto storage element 34.

In one embodiment, the detector 3 is an optical scanner for determining the position of the blade 16 relative to the mask 14. Alternatively, the detector 3 includes a position transducer that identifies the position of blade 16 by counting hash marks, or other identifying marks, as it moves in response to motor 24. The identifying marks can be on the drive belt 26. Alternatively, they can be marks along the guide rail 30 that enable a user to identify and input the position of blade 16 relative to mask 14. The receiver 2 is an input device, such as a keyboard, touch sensitive panel, or touch sensitive video screen, that enables an operator to input the desired velocity associated with the detected position.

A further embodiment of the input element 36 includes a reader 6 for inputting to system 10 a data file containing information on the layout of the mask 14. For example, the data file can be a computer aided design (CAD) file containing detailed information on the layout of the integrated circuit mounting pads on a printed circuit board, i.e. where leads of electronic components are to be mounted. Further in accordance with this embodiment, an analyzer 4 is coupled with the reader 6 for analyzing the layout information obtained by the reader 6 and for determining velocities to be associated with selected locations on a mask 14.

The analyzer 4 obtains data regarding the mask 14 from the reader 6 and identifies the position and dimensions of selected mounting pads on the printed circuit board and associates a particular velocity with the selected mounting pad positions. The analyzer 4 selects a first opening by identifying the first opening found in mask 14 near a first edge of mask 14. The analyzer 4 then proceeds along direction 22 from the first edge of mask 14 and selects the next opening having a dimension, as measured along direction 22, differing from the first opening. The analyzer 4 continues this process of scanning or otherwise examining the mask 14 along the direction 22, and selecting those mask openings whose dimensions differ from the previously selected opening. The analyzer 4 associates with each selected opening a velocity that is based upon the dimensions of the opening, for example as identified by the reader 6. Preferably, the velocity is determined based upon the dimensions of the selected openings along direction 22.

A third embodiment of the input element 36 has an optical scanner 5 coupled with an analyzer 4. The scanner 5 determines the layout of a mask 14 by viewing the mask in a manner that allows the scanner to obtain data concerning the location of various apertures in the mask 14 and the size of the apertures. The analyzer 4 processes the data generated by scanner 5 to select each of particular openings in the mask 14, and to associate a velocity with each such selected opening.

With further reference to FIG. 1, the motor controller 32, according to another aspect of this invention, includes a governor for limiting the acceleration, or rate of change in velocity, of the variable speed motor 24. The governor advantageously prevents unwanted discontinuities in the movement of the blade element 16 across the mask 14 by limiting the acceleration and the deceleration of the motor 24. The acceptable range of acceleration generally varies from about two feet per second per second to about 40 feet per second per second. Below the minimum value, the distance required to change from a first velocity to a second velocity may be excessively large. Above the maximum value, the blade element 16 can experience a discontinuous, jerking motion that can cause irregularities in the application of the solder or other material being deposited. In one preferred embodiment, the acceleration of the motor 24 is 7.65 feet per second per second.

The illustrated motor controller 32 also includes a data processor for calculating a distance, D, required to change from a first velocity, V1, to a second velocity, V2, at a particular acceleration, A. The distance D can be calculated according to various known methods as disclosed for example in *University Physics*, by Sears, Zemansky, and Young, which is expressly incorporated herein by reference. According to one such method, the distance D can be calculated according to the following mathematical function, using the parameters identified above:

$$D = \frac{V2 - V1^2}{2A}.$$

The distance, D, required to change velocities is used by the motor controller 32 to ensure that the blade element 16 reaches the desired velocity at a particular position on the mask 14, with an acceptable positive or negative acceleration. For example, the controller 32 begins the change from a first velocity to a second velocity at a distance D preceding the location associated with the second velocity and stored in element 34.

Figure 2A:
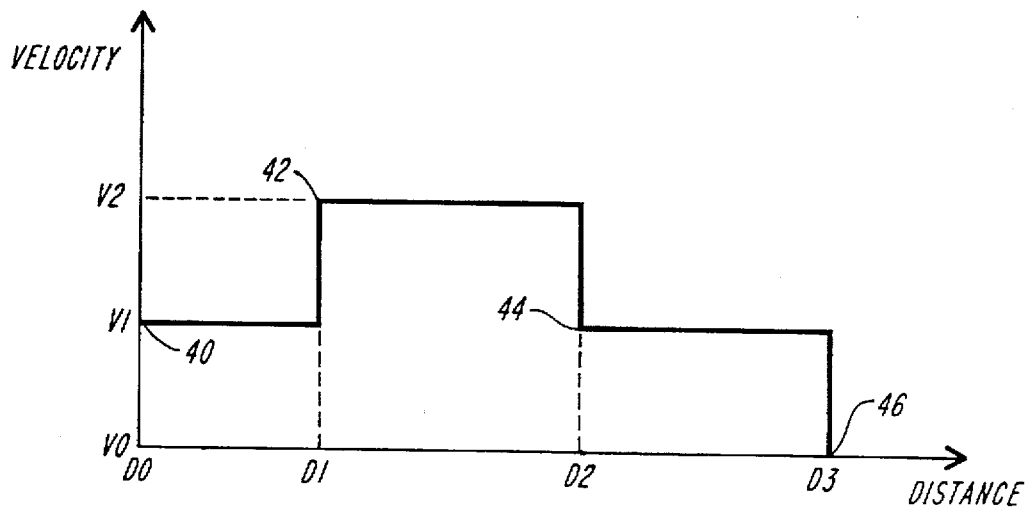
FIG. 2A is a graph of the movement profile, for the system of FIG. 1, illustrating an association between distance and velocity.

FIG. 2A shows one illustrative movement profile of the FIG. 1 blade element 16 based on a hypothetical association of position and velocity stored in the storage element 34 of system 10. For example, the addressable storage element 34 stores the following set of data: a data point 40 associating location D0 with velocity V1, a data point 42 associating location D1 with velocity V2, a data point 44 associating location D2 with velocity V1, and a data point 46 associating a location D3 with velocity V0. Location D0 indicates a beginning edge, or forward position, for blade element 16 in relation to mask 14, and D3 indicates a location on mask 14 along direction 22 that is the stop edge, or return position, for blade element 16. Locations D1 and D2 are intermediate points between locations D0 and D3 on mask 14 along direction 22.

The controller 32, when operating in accord with the movement profile illustrated in FIG. 2A, moves the blade element 16 at a velocity V1 from location D0 to location D1, at a velocity V2 from location D1 to location D2, at a velocity V1 from location D2 to D3, and at a velocity V0 from location D3 onward to the end of travel. The illustrated movement profile indicates that from location D0 to D1 and from location D2–D3 the blade element 16 traverses openings in mask 14 having a relatively small dimension along direction 22, as compared to the relatively larger mask openings traversed by blade 16 from location D1–D2.

Figure 2B:
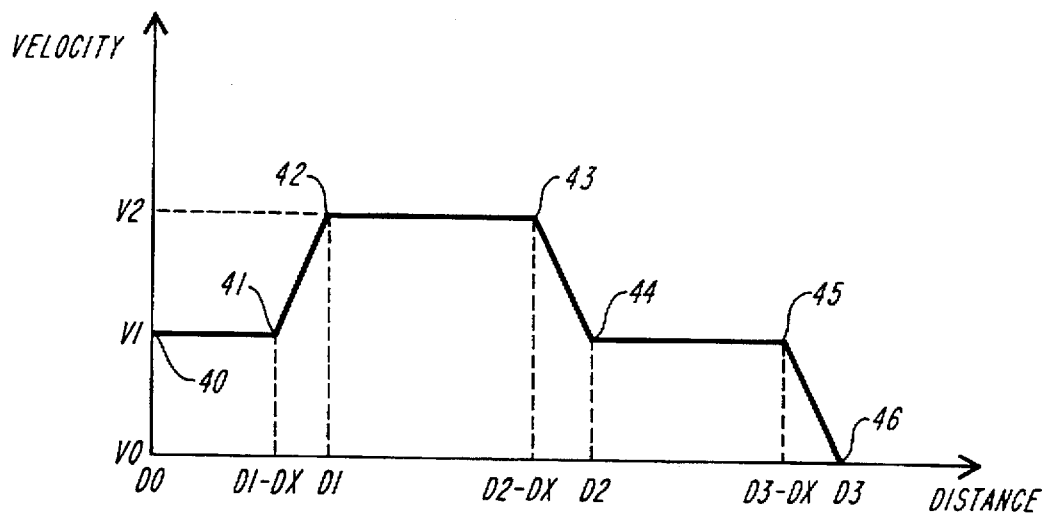
FIG. 2B is a graph of a movement profile, for the system of FIG. 1, illustrating an association between velocity and distance as implemented according to a further embodiment of this invention.

FIG. 2B shows a movement profile of the FIG. 1 blade element 16 based on the same hypothetical data set whose movement profile is illustrated in FIG. 2A, however, FIG. 2B further illustrates a movement profile resulting when controller 32 anticipates a change in the speed of blade element 16. In particular, FIG. 2B shows a movement profile resulting when controller 32 reacts to requested changes in velocity a distance DX before the actual location associated with the new velocity.

FIG. 2B includes a data point 40 at location D0 and velocity V1, a data point 41 at location D1 minus distance DX and velocity V1, a data point 42 at location D1 and velocity V2, a data point 43 at location D2 minus distance DX and velocity V2, a data point 44 at location D2 and velocity V1, a data point 45 at location D3 minus distance DX and velocity V1, and a data point 46 at location D3 and velocity V0. Data points 40, 42, 44, and 46 are stored in addressable storage element 34 and indicate the desired velocities and their associated positions, while data points 41, 43 and 45 result from processing by controller 32.

Variable speed motor 24 generally can not change velocity instantaneously, thus controller 32 advantageously anticipates changes in velocity requested by addressable storage element 34 and begins acting before blade element 16 reaches a position associated with a new velocity. For example, the data processor calculates the distance DX required to change from the current velocity to the new velocity at a given level of acceleration, and controller 32 begins changing the velocity of motor 24 when blade 16 is a distance DX prior to the next location stored in addressable storage element 34. By anticipating the change in velocity, controller 32 ensures that blade element 16 can reach the desired velocity associated with the next location stored in addressable element 34.

Figure 3:
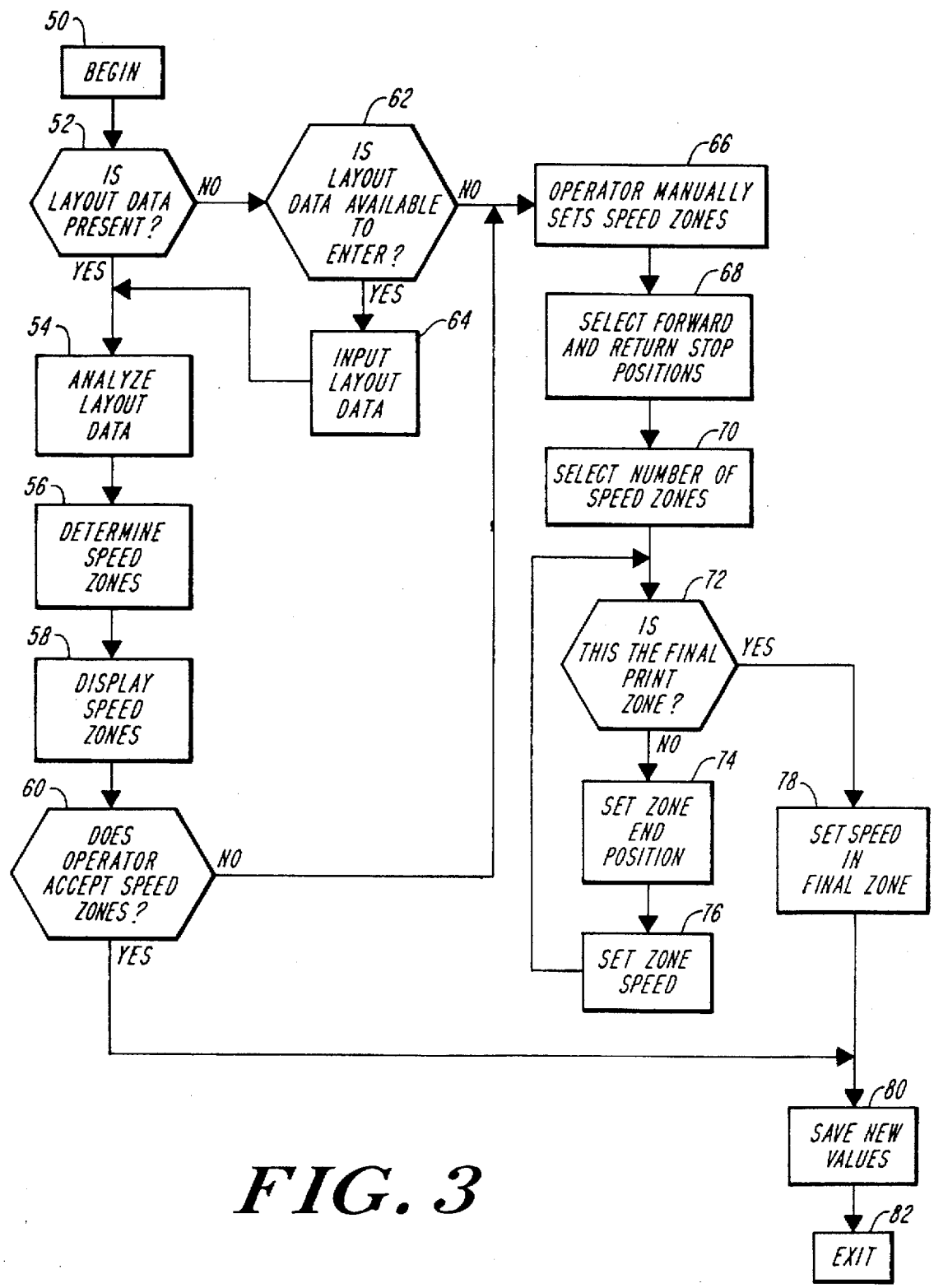
FIG. 3 is a flow chart for steps for generating data contained in the addressable storage element for the system of FIG. 1.

FIG. 3 shows an illustrated flow diagram of operations for generating and entering a set of print zones into the FIG. 1 addressable storage element 34, where each print zone represents an area or region of apertures in mask 14 which have a common minimal dimension along the axis 22 of FIG. 1. A controller 32 can have a programmable microprocessor 32A (FIG. 1) connected the storage element 34 and the input element 36 to provide the illustrated operating sequence. Depending on the extent of system automation, an operator can provide operations and decisions, in conjunction with the microprocessor 32A of the FIG. 1 system.

Logical flow in the illustrated sequence begins at action box 50 and proceeds to decision box 52. Decision box 52 illustrates the microprocessor 32A examining whether layout data on the mask is currently present. If layout data is present control proceeds to action box 54, and if layout data is not present control branches to decision box 62. Decision box 62 illustrates a determination by either microprocessor 32A or the operator regarding whether layout data is available to enter. Control branches to action box 66 if layout data is not available to enter and control branches to action box 64 if layout data is available to enter. In accordance with action box 64, layout data is input regarding mask 14 or panel 12 by reader 6 or optical scanner 5 of FIG. 1. For example, the layout data is input through either the reader 6 reading an electronic data file, or the optical scanner 5 viewing the circuit board or the apertured mask. After action box 64, logical flow returns to action box 54.

As illustrated by action box 54, layout data on mask 14 or panel 12 is analyzed by analyzer 4 of FIG. 1. The analysis of the data includes determining the location and size of various openings in the mask or panel undergoing analysis.

After analysis, flow proceeds to action box 56 to determine the speeds zones and the velocity associated with the speed zones. Action box 56 illustrates the formation of speed zones by analyzer 4. Analyzer 4 forms each speed zone by grouping together adjacent apertures having similar dimensions along direction 22. Each grouping of similarly sized apertures forms a speed zone. Analyzer 4 of FIG. 1 also associates a velocity with each speed zone formed, where the velocity of each speed zone is dependent upon the dimensions of the apertures along direction 22 in the particular speed zone being analyzed.

Flow proceeds to action box 58 where the speed zones are displayed to the operator by microprocessor 32A. At decision box 60, the operator determines whether or not these speed zones are acceptable. If the speed zones are acceptable control proceeds to action box 80, if the speed zones are found unacceptable control branches to action box 66.

The operation of box 66 begins the logical flow for manually inputting the speed zones. The operator selects the forward and stop positions for blade element 16 (action box 68). This is accomplished by moving blade element 16 to the first edge of mask 14, or panel 12, and utilizing detector 3 to identify the current position of blade element 16 to system 10 as the forward stop position. The operator then moves blade element 16 to the second edge of mask 14, or panel 12, and uses detector 3 to identify the current position of blade element 16 to system 10 as the return stop position.

Subsequent to the operation of box 68, the operator selects the number of speed zones desired in mask 14 or panel 12 (see action box 70). Flow then proceeds to decision box 72 where the operator identifies whether this is the final print zone. Control continues to action box 74 if this is not the final print zone, and control branches to action box 78 if this is the final print zone.

As indicated at action box 74, the operator sets the zone end position for the current zone by moving blade element 16 to the end of the current speed zone and by identifying the position identified by detector 3 of FIG. 1 as the end of the speed zone. Logical flow proceeds to action box 76, where as indicated, the operator inputs the speed to be associated with this particular speed zone, control then returns to decision box 72.

In accordance with action box 78, the operator inputs the speed associated with the final zone (see action box 78), and control then flows to box 80.

At action box 80, the locations of the speed zones and their associated velocities are saved to the addressable storage element 34 of FIG. 1. Flow then proceeds to action box 82 where the program ends.

While the invention has been shown and described having reference to specific preferred embodiments, those skilled in the art will understand that variations in form and detail may be made without departing from the spirit and scope of the invention.

Having described the invention, what is claimed as new and secured by letters patent is:

1. Apparatus for applying extrudable material through a mask apertured with openings, comprising blade means for transferring the extrudable material through the openings in the mask, variable speed motor means coupled with said blade means for moving said blade means across the mask along a first axis at a variable selected velocity, addressable storage means for storing a data set associating a velocity data point with a location along the first axis, said velocity data point being determined as a function of a dimension of an opening in the mask, and motor control means coupled with said addressable storage means and with said variable speed motor means for controlling the variable selected velocity based upon said data set.

2. Apparatus according to claim 1, wherein said motor control means further comprises a data processor for calculating a distance, D, in which to change from a first velocity, V1, to a second velocity, V2, at an acceleration, A, in accord with the mathematical function $$D = \frac{V2 - V1^2}{2A}.$$

3. Apparatus according to claim 1, wherein said motor control means further comprises a governor for limiting acceleration of said variable speed motor means to the range of about two feet per second per second to about forty feet per second per second.

4. Apparatus according to claim 1 further comprising input means coupled with said addressable storage means for generating the data set.

5. Apparatus according to claim 4 wherein said input means comprises a detector for detecting the location along the first axis of said blade element relative to the mask, and a receiver coupled with said detector for receiving the velocity data point associated with the location along the first axis of said blade element relative to the mask.

6. Apparatus according to claim 4 wherein said input means comprises a reader for reading a data file containing layout data for mounting pads of a group of electronic components to be positioned on a printed circuit board, and an analyzer coupled with said reader for identifying a location of at least one mounting pad and for determining an input velocity associated with the location of said at least one mounting pad.

7. Apparatus according to claim 4 wherein said input means comprises an optical scanner for determining a layout of the mask, and an analyzer coupled with said optical scanner for identifying a location of at least one opening in the layout of the mask and for determining an input velocity associated with the location of said at least one opening.

8. An apparatus according to claim 1, wherein said motor control means controls the variable selected velocity as a function of the position of said blade means relative to the opening in the mask.

9. Apparatus for applying extrudable material through a mask apertured with openings, comprising a blade element for transferring the extrudable material through the openings in the mask, a variable speed motor coupled with the said blade element for removing said blade means across the mask along the first axis at a variable selected velocity, a memory element for storing a data set associating at least a first velocity data point with a location of at least a first opening along the first axis relative to the mask, the first velocity data point being dependent upon the dimension of the first opening along the first axis, and a controller coupled with said memory element and said variable speed motor for controlling the variable selected velocity according to said data set.

10. A method for applying extrudable material through a mask apertured with openings, comprising the steps of sweeping a blade element at a selected velocity across the mask along a first axis such that the extrudable material is transferred through openings in the mask, and changing from the selected velocity to a first velocity in accordance with a data set stored in an addressable storing element, the data set associating a first velocity with a first location along the first location along the first axis, wherein the first velocity is determined as a function of a dimension of an opening in the mask.

11. A method in accordance with claim 10 further comprising the step of generating the data set stored in the addressable storage element.

12. A method in accordance with claim 11 wherein the step of generating the data set stored in the addressable storage element further comprises the steps of moving the blade element to the first location along the first axis relative to the mask, detecting the first location along the first axis of the blade element after said moving step, and determining the first velocity associated with said detected location.

13. A method in accordance with claim 11 wherein the step of generating the data set stored in the addressable storage element further comprises the steps of obtaining layout data for mounting pads for a group of electronic components to be positioned on a printed circuit board, analyzing the layout data to determine the first location of at least one mounting pad, calculating the first velocity based upon the dimension along the first axis of said mounting pad, and associating the first velocity with the first location.

14. A method in accordance with claim 10 further comprising the step of limiting the acceleration of the blade element to a range of 2 feet per second$^2$ to 40 feet per second$^2$.

15. A method in accordance with claim 10 further comprising the steps of calculating a distance necessary to change from the selected velocity to the first velocity associated with the first location along the first axis, and initiating change from the selected velocity to the first velocity when the blade element reaches a second location along the first axis equal to the first location minus said calculated distance.

16. A method in accordance with claim 10 further including the step of varying the sweep velocity of the blade element based upon the position of the blade element relative to the opening in the mask.

17. A method for applying extrudable material through a mask apertured with openings, comprising the steps of:

sweeping a blade element at a selected velocity across the mask along a first axis, such that the extrudable material is transferred through openings in the mask, and changing the selected velocity of a function of the size of the openings in the mask along the first axis for obtaining blade sweep velocity responsive to the size of the openings.

* * * * *